United States Patent

[11] 3,633,050

[72] Inventor Chester J. Zajac
Thomaston, Conn.
[21] Appl. No. 2,344
[22] Filed Jan. 12, 1970
[45] Patented Jan. 4, 1972
[73] Assignee Robertshaw Controls Company
Richmond, Va.

[54] TIME DELAY CIRCUIT WITH NORMALLY CONDUCTING FET GATED OFF DURING TIME DELAY PERIOD
8 Claims, 1 Drawing Fig.

[52] U.S. Cl. 307/293, 307/247 A, 307/251
[51] Int. Cl. H03k 17/28
[50] Field of Search 307/247 A, 293, 294, 251

[56] References Cited
UNITED STATES PATENTS

| | | | |
|---|---|---|---|
| 2,923,863 | 2/1960 | Chesson et al. | 307/293 X |
| 2,947,916 | 8/1960 | Beck | 307/293 X |
| 3,034,024 | 5/1962 | Mierendorf et al. | 307/293 X |
| 3,165,648 | 1/1965 | Sainsbury | 307/293 |
| 3,392,352 | 7/1968 | White | 307/293 X |

*Primary Examiner*—John S. Heyman
*Attorneys*—Auzville Jackson, Jr. and Robert L. Marben

ABSTRACT: A solid-state timer is provided using a field-effect transistor connected to be biased "on" and during the timed period held "off" by a prior charged capacitor. The operating condition of the field-effect transistor determines the operative status of a second transistor connected to a relay. A transient bypass filter is provided at the input of the second transistor. The relay is provided with a contact connected to provide a holding circuit so only momentary operation of a time period initiating switch is needed.

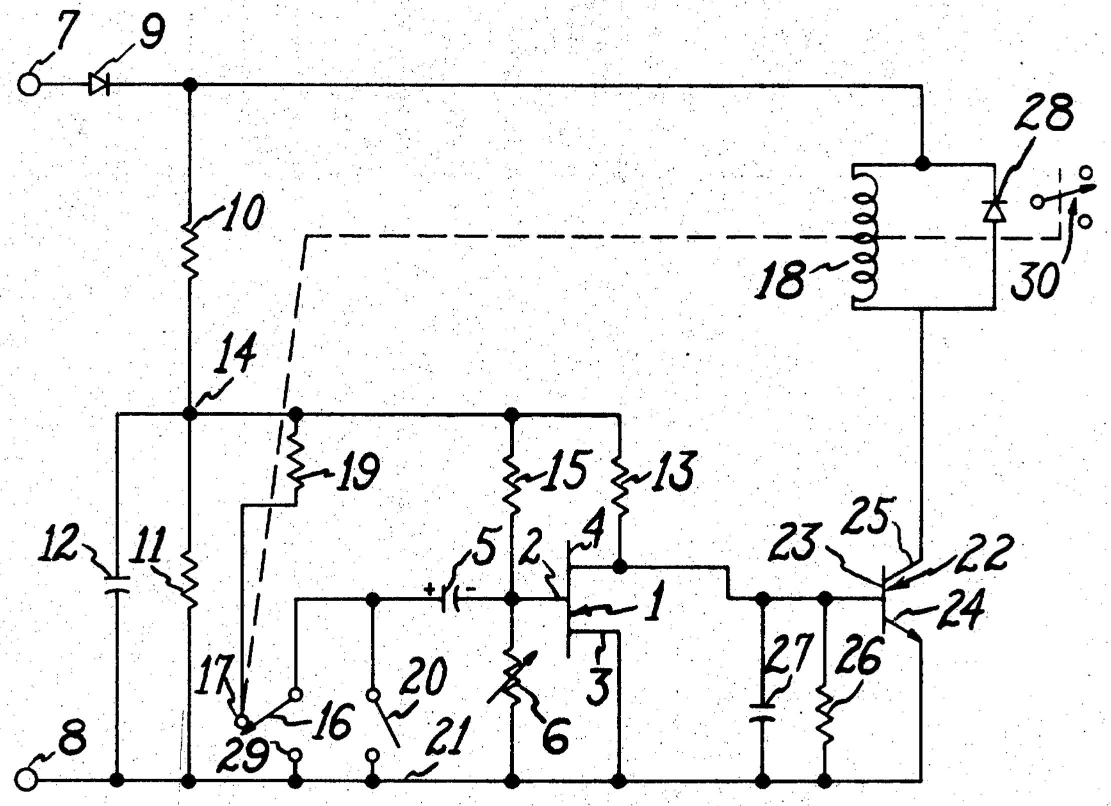
INVENTOR
CHESTER ZAJAC
BY
Robert L. Marben
ATTORNEY

TIME DELAY CIRCUIT WITH NORMALLY CONDUCTING FET GATED OFF DURING TIME DELAY PERIOD

BACKGROUND OF THE INVENTION

The invention presented herein relates to electronic time delay circuits and more particularly to time delay circuits using a field-effect transistor as a voltage sensor.

A known time delay circuit using a field-effect transistor provides a charging circuit for a capacitor which requires a double-pole, double-throw switch to connect the capacitor to the field-effect transistor to bias it in the "off" operating mode. This known arrangement has been found to be susceptible to false triggering of the field-effect transistor. In addition, the switching arrangement used in the prior known circuit also required a resetting action by the operator prior to the initiation of a timed period.

SUMMARY OF THE INVENTION

It is an object of the invention presented herein to provide a time delay circuit which uses a simplified switching arrangement for charging a timing capacitor and then at the beginning of the timing period connects the capacitor so the charge biases the field-effect transistor in the "off" operating mode.

Another object of the invention presented herein is to provide for automatic resetting of the circuit upon completion of the timed period provided.

A further object of the invention presented herein is to provide a time delay circuit in which a field-effect transistor is used that is highly biased "on" prior to the timed period providing a circuit that is immune to noise and transients present on normal AC lines.

These objects and other advantages are attained by the circuit shown in the single attached drawing which is described in detail to provide a complete disclosure of the invention.

DESCRIPTION OF THE PREFERRED EMBODIMENT

Referring to the drawing, the circuit shown embodying the invention includes a circuit portion which provides a timed period. The field-effect transistor 1, having gate 2, source 3 and drain 4 electrodes, plus capacitor 5 and the variable resistor 6 are included in the timing circuit portion.

The circuit shown is intended to be operated by connection of terminals 7 and 8 to normally available 110 v. AC power source. The alternating current is half-wave rectified by diode 9 connected to terminal 7. A voltage divider provided by series connected resistors 10 and 11 connected between the cathode of diode 9 and terminal 8 is used to provide the desired operating DC voltage for the field-effect transistor 1. Resistor 11, which has one end electrically connected to terminal 8, has a capacitor 12 connected in parallel with it to smooth out the half-wave rectified current.

The field-effect transistor 1 has its source electrode 3 electrically connected directly to terminal 8, and has its drain electrode 4 connected via a resistor 13 to the connection 14 which is the common connection for the series connected resistors 10 and 11. A slight positive bias (+.2 v.) is provided for the transistor 1 since a resistor 15 is connected between the connection 14 and the transistor gate 2 to cause such bias to be developed across the gate-source junction. While the field-effect transistor 1 shown is an N-type and is normally conducting in the "on" mode without any gate to source bias, the use of a slight positive gate to source bias is important since it makes the field-effect transistor 1 highly immune to noise or transient triggering of the timer.

The timing capacitor 5 has one side connected to the gate 2. Prior to the initiation of a timed period the other side of capacitor 5 is connected via movable contact 16 and fixed contact 17 of a relay to resistor 19 which is connected to the connection 14. Contacts 16 and 17 are normally closed which is the condition that exists when the winding 18 of the relay is not energized. The winding 18, as will be explained, is not energized prior to a timed period. The relay may be read relay type which has the advantage of providing sealed contacts.

With the capacitor 5 connected as described the capacitor 5 is charged via the gate 2 and source 3 of the field-effect transistor 1. The side of the capacitor 5 connected to the gate 2 is thus made negative with respect to the other side of the capacitor 5.

A switch 20, which is preferably a spring-loaded, single-pole, single throw type, is connected between the contact 16 side of capacitor 5 and the conductor 21. Conductor 21 connected to terminal 8 represents the common connecting conductor for the circuit for electrically connecting a number of the elements in the circuit directly to terminal 8. The switch 20 is normally open and is, as mentioned, spring loaded so only momentary closure is obtained when it is actuated. Thus, when capacitor 5 is charged, as has been indicated, closure of switch 20 causes the field-effect transistor 1 to be reversed biased by the charge present on capacitor 5 to place the transistor in the "off" mode and provides for reduction of the negative charge on the capacitor 5 via resistors 6 and 15. This causes the drain 4 to source 3 resistance to become high causing the voltage at the drain 4 to rise.

The voltage at drain 4 determines the operating status of an amplifier stage which includes a transistor 22. Transistor 22 has its base 23 connected to drain 4 so its level of conduction is determined by the voltage at drain 4. The emitter 24 of transistor 22 is connected to terminal 8 via the common connecting conductor 21. The collector 25 of transistor 22 is connected via the relay winding 18 to the cathode of diode 9. With the base 23 of the transistor 22 connected to the drain 4 of the field-effect transistor 1 it can be seen that transistor 22 is conducting to energize relay winding 18 only when the field-effect transistor 1 is biased "off" to raise the drain 4 to source 3 resistance and therefore the voltage at drain 4.

Since the relay winding 18 when energized is operating on half-wave rectified current, a diode 28 is connected across the winding 18 to improve the relay performance by sustaining current flow through the winding 18 during each half-wave cycle when transistor 22 is not conducting. When the relay winding 18 is energized the movable contact 16 is moved into contact with the fixed contact 29 provided by the relay. Fixed contact 29 connects with common conductor 21. The closure of contacts 16 and 29 thus completes a circuit identical to that provided by the closure of switch 20 thus allowing momentary operation of switch 20. The relay is also provided with at least one additional switch 30 for use in controlling a circuit in accordance with the timed period provided by the circuitry.

Further immunity of the circuit to noise and transients presented via the commercial 110 v. AC source is provided by the bypass filter comprising resistor 26 and capacitor 27 connected at the input of the transistor 22. The resistor 26 and capacitor 27 are each connected at one end to the base 23 of transistor 22 and at the other end to the conductor 21.

CIRCUIT OPERATION

Upon connection of the circuit to a 110 v. AC supply the field-effect transistor 1 conducts with a positive bias supplied via the resistor 15 and the gate 2 to source 3 junction connected to conductor 21. The drain 4 to source 3 resistance is then low so transistor 22 is not conducting. With transistor 22 not conducting, relay winding 18 is not energized. Contacts 16 and 17 controlled by the relay are then in the normally closed position. Capacitor 5 is thus rapidly charged to the DC voltage level present at point 14 via resistor 19, contacts 16 and 17 and the low gate 2 to source 5 resistance path to conductor 21. The plate or side of capacitor 5 connected gate 2 then presents a negative potential with respect to the other plate or side of capacitor 5. The circuit is then in condition for initiation of a timed period.

Selection of the desired time period is accomplished by adjustment of the variable resistor 6 which, with the value of the capacitor 5 and a constant which is dependent on the pinch-off voltage of the field-effect transistor 1, determines the length of the timed period.

Initiation of a timed period is accomplished by momentary closure of switch 20 which causes the charge on capacitor 5 to reverse bias the field-effect transistor 1 to turn it "off" Turn "off" of the transistor 1 causes the drain 4 to source 3 resistance to become high. With drain 4 presenting a higher voltage, transistor 22 is provided with a base current causing it to conduct to energize relay winding 18. Operation of the relay places contacts 16 and 29 in the closed position providing a circuit which parallels that provided by the closure for switch 20 so there is no need for the operator to keep switch 20 closed for the duration of the timed period. The capacitor 5 gradually discharges until its voltage is reduced sufficiently to cause the field-effect transistor 1 to revert to its "on" condition lowering the voltage at drain 4 causing the transistor 22 to cease conducting. The relay winding 18 is then no longer energized causing contacts 16 and 29 to open and contacts 16 and 17 to close again. The charge circuit for capacitor 5 is thus automatically completed to place the circuit in condition for another timed period to be initiated by momentary closure of switch 20.

A circuit in accordance with the foregoing description has been constructed using the following capacitor and resistor values with transistors of the type indicated:

| | |
|---|---|
| Resistor 6 | 250 K ohms |
| Resistor 10 | 6.9 K ohms |
| Resistor 11 | 2.7 K ohms |
| Resistor 13 | 10.0 K ohms |
| Resistor 15 | 4.7 M ohms |
| Resistor 19 | 4.7 K ohms |
| Resistor 26 | 4.7 K ohms |
| Capacitor 5 | 3 Mf. |
| Capacitor 27 | 0.05 Mf. |
| Transistor 1 | MJE 340 |
| Transistor 22 | 2N5163 |

Various modifications may be made in the circuitry shown without departing from the spirit or scope of the invention presented herein. The invention is, therefore, limited only as indicated by the scope of the appended claims.

What is claimed is:

1. A timing circuit including means providing a DC voltage from an AC source, a field-effect transistor, means connected to said field-effect transistor and said first-mentioned means providing positive biasing of said field-effect transistor to the "on" operating mode, said field-effect transistor having gate, drain and source electrodes, a circuit portion including a capacitor having one side connected to said gate electrode, a switch connecting said capacitor to said DC voltage for charging via said gate and source electrodes, said switch having two connecting positions, one of which when used connects said capacitor for charging said capacitor via said gate and source electrodes and the other switch position when used connects said capacitor for discharge and connects said capacitor so the voltage on said capacitor biases said field-effect transistor in the "off" operating mode until the voltage on said capacitor discharges to a level to cause said field-effect transistor to revert to the "on" operating mode, the "off" to "on" periods providing a timed period.

2. A timing circuit in accordance with claim 1 wherein said means providing positive biasing includes a resistor connected to said gate electrode, said resistor, said gate electrode and said source electrode forming a series circuit which is connected across said DC voltage.

3. A timing circuit in accordance with claim 1 wherein said switch is a magnetically controlled switch.

4. A time controlled switching circuit including means providing a DC voltage from an AC source, a field-effect transistor having gate, drain and source electrodes, means connected to said field-effect transistor and said first-mentioned means providing positive biasing of said field-effect transistor to the "on" operating mode, an electromechanical switching device including a winding and a switch having two connecting positions controlled in accordance with the level of current flow through said winding, means including a semiconductor device connected to said field-effect transistor controlling the level of current flow through said winding, a circuit portion including a capacitor having one side connected to said gate electrode with the other side connected by one position of said switch to said DC voltage for charging via said gate and source electrodes and said other side connected by the other position of switch for discharging said capacitor and connecting said capacitor so the voltage on said capacitor biases said field-effect transistor in the "off" operating mode until the voltage on said capacitor discharges to a level to cause said field-effect transistor to revert to the "on" operating mode, the "off" to " on" periods providing a timed period, and a normally open second switch providing, when closed, an electrical path equivalent to that provided by said two-position switch when said two-position switch is in said other position.

5. A time controlled switching circuit in accordance with claim 4 wherein said second switch is momentary actuatable switch.

6. A time controlled switching circuit in accordance with claim 4 wherein said means including a semiconductor device responds to said field-effect transistor when in said "off" operating mode causing the level of current flow through said winding to be such as to cause said two-position switch to be placed in said other position.

7. A time controlled switching circuit in accordance with claim 4 wherein said first-mentioned means providing positive biasing includes a resistor connected to said gate electrode, said resistor, said gate electrode and said source electrode forming a series circuit which is connected across said DC voltage.

8. A time controlled switching circuit in accordance with claim 4 wherein said means including a semiconductor device includes a bypass filter connected to said semiconductor device.

* * * * *